United States Patent [19]

Prevot et al.

[11] Patent Number: 4,725,803
[45] Date of Patent: Feb. 16, 1988

[54] GRADIENT COIL FOR NUCLEAR MAGNETIC RESONANCE IMAGE FORMING APPARATUS

[75] Inventors: Claude Prevot, Antony; Bernard Rigeade, Rambouillet; Jean Miscopein, Bures Sur Yvette, all of France

[73] Assignee: Thomson-CGR, Paris, France

[21] Appl. No.: 918,972

[22] Filed: Oct. 15, 1986

[30] Foreign Application Priority Data

Oct. 18, 1985 [FR] France ............................ 85 15511

[51] Int. Cl.$^4$ ............................................. H01F 5/00
[52] U.S. Cl. ...................................... 335/299; 324/320
[58] Field of Search ................ 335/299; 324/318, 319, 324/320, 321

[56] References Cited

U.S. PATENT DOCUMENTS

| | | | |
|---|---|---|---|
| 4,509,030 | 4/1985 | Vermilyea | 335/299 X |
| 4,591,818 | 5/1986 | Butson | 335/299 |
| 4,595,900 | 6/1986 | Kamil et al. | 335/299 |
| 4,636,729 | 1/1987 | Maurer et al. | 335/299 X |

FOREIGN PATENT DOCUMENTS

| | | |
|---|---|---|
| 0073402 | 9/1983 | European Pat. Off. . |
| 0152588 | 8/1985 | European Pat. Off. . |
| 1946059 | 4/1970 | Fed. Rep. of Germany . |
| 2290748 | 4/1976 | France . |
| 2557351 | 4/1985 | France . |

Primary Examiner—George Harris
Attorney, Agent, or Firm—Oblon, Fisher, Spivak, McClelland & Maier

[57] ABSTRACT

A gradient coil is provided for a nuclear magnetic resonance image forming apparatus, the gradient coil being formed of four identical arrangements symmetrical with respect to the centre of a predetermined examination space. These arrangements comprise conductors formed in the shape of a saddle. In a particular embodiment for each arrangement two groups of conductors are provided. They may moreover be superimposed. In the invention, the conductors are flat conductors. Preferably their section is rectangular, the large side being greater than or equal to two and a half times the small side. The choice of flat conductors reduces the self-inductance of the system thus constructed. Finally, it is the necessary driving power which is reduced for establishing a field gradient. The temperature behavior of the whole of the apparatus is improved thereby.

6 Claims, 4 Drawing Figures

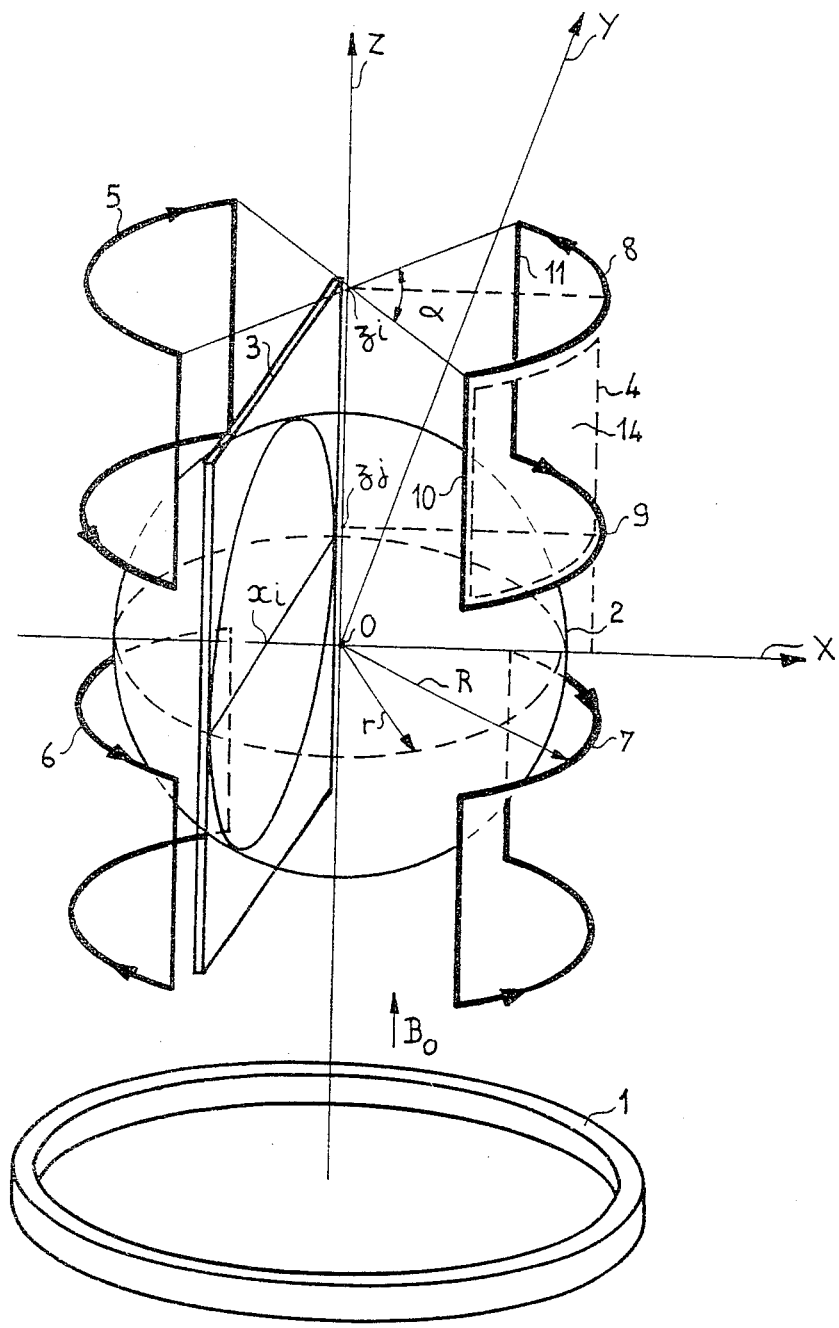
FIG_1

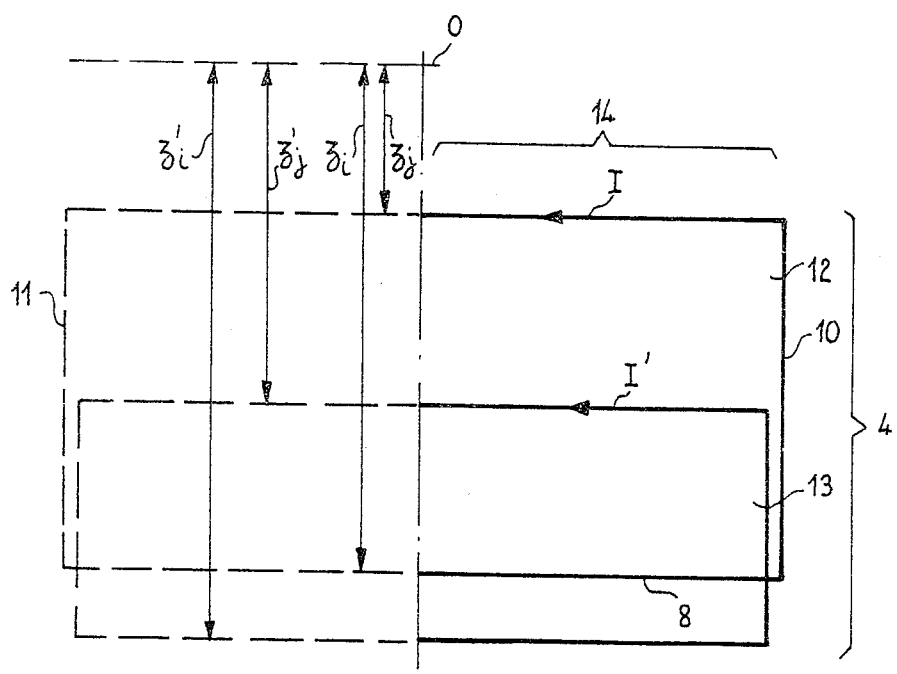
FIG_2

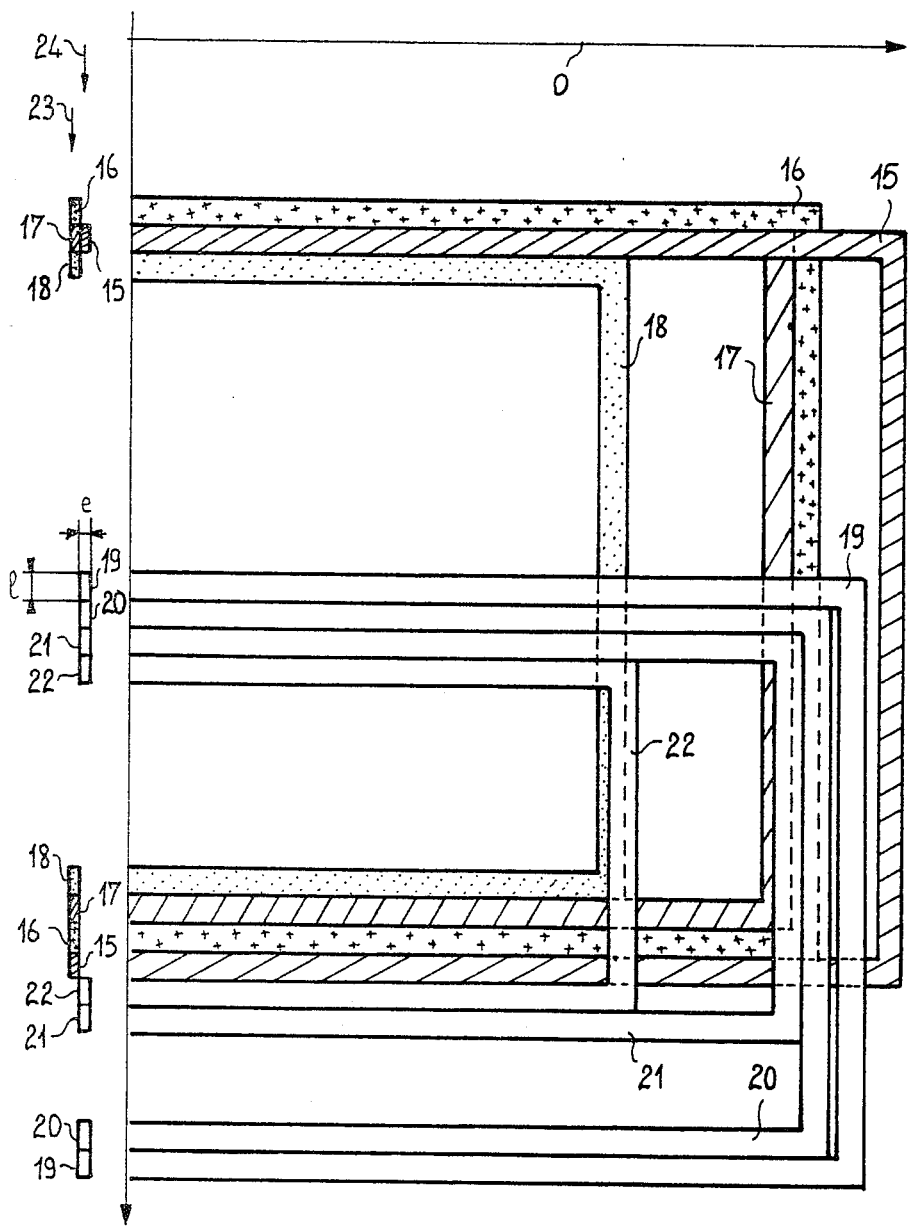

GRADIENT COIL FOR NUCLEAR MAGNETIC RESONANCE IMAGE FORMING APPARATUS

BACKGROUND OF THE INVENTION

The present invention relates to a gradient coil for nuclear magnetic resonance image forming apparatus. It finds its application more particularly in the medical field where the formation of images by nuclear magnetic resonance is unanimously recognized as an aid to diagnosis. It may of course be used in other fields. The purpose of the present invention is to contribute to the creation of images of a body to be examined which are more faithful and more precise in their resolution.

1. Field of the Invention

A nuclear magnetic resonance image forming apparatus has essentially three types of coils. The purpose of a first type of coil (which may possibly be replaced by a permanent magnet) is to create an intense homogenous field $B_o$ in a predetermined space. The purpose of a second type of coil, called radiofrequency coil, is to subject a body examined and placed under the influence of the field of the first coils to sequences of radiofrequency excitation, and to measure a radiofrequency signal reemitted in return by particles of the body. The radiofrequency response is a volume response: all the particles of a region of the body subjected to the examination emit their radiofrequency response at the same time. In order to create the image it is necessary to differentiate these responses. For this, the image forming apparatus comprise a third type of coil called gradient coil, for superimposing on the intense field additional field components. The value of these components depends on the coordinates in space of the place of their application. Conventionally, it is proposed to organize this differentiation along three orthogonal axes X, Y, Z. By convention, axis Z is generally colinear with the intense field created by the first type of coil. In other words, each location of the space may be coded by a different field value: the modifications which result therefrom in the reemitted signal are used.

Gradient coils are consequently divided into three families: that which creates a gradient along X, that which creates a gradient along Y, and that which creates a gradient along Z. The purpose of the invention is more particularly to propose an improvement to the construction of the first two families. A field gradient along X is a magnetic field in which the distribution of the amplitude of the component colinear with the intense field (Z), in space, depends solely on the coordinate $x_i$ of its place of application. In practice, it is even simply proportional thereto. This means that all the particles of a body to be examined situated in a plane parallel to Y-Z and with a given abscissa $x_i$ are subject to a total field $B_o + G_x \cdot x_i$. The gradient $G_x$ is the slope of the variation of the component along Z of the additional field provided by these gradient coils X.

The acquisition of an image requires during application of the excitation sequences, the joint application of field gradient sequences. The field gradient sequences depend on the image forming method used. This method may for example be of the 2 DFT type perfected by Messrs. A. KUMAR and R. R. ERNST or for example of the retroprojection type perfected by M. P. C. LAUTERBUR. Whatever the image forming method chosen, the particularity of the field gradients is that they are pulsed. They are established, they persist for a short time, then they are cut off. This may happen once or several times during the sequence. This particularity means consequently that the operation of the coils of the third type must be studied not only under permanent operating conditions, during the application of the gradients, but also during transitory conditions resulting from establishment and cutting off thereof. Another particularity of the field gradients relates to their homogeneity. By homogeneity is is meant the compliance, with a given tolerance and for a real field gradient, with an ideal theoretical distribution which it is desired to impose. In fact, the inhomogneities result in falsifying the differentiation which it is desired to impose in space and which is the very base of the principle of image formation. From this point of view the problems of homogeneity must be solved for the gradients as well as they are for the intense homogenous field. The solution of the problems created by the transitory conditions is generally solved by forming three types of coils as small as possible. The smaller they are, the smaller their self-inductance and the smaller the power required for producing the field. On the other hand, for the homogeneity, the larger the coils the more the distribution of the fields which they produce may be considered as homogenous. These two tendencies are therefore contradictory. In general, the gradient coils are placed on the outside and as close as possible to the radiofrequency coils. These latter define therewithin the examination volume where the body is placed.

2. Description of the Prior Art

Such gradient coils are known in the prior art, in particular from the European patent application No. 82 107 453.1 filed on Aug. 16, 1982. These coils include conductors formed about a cylinder along a so-called saddle contour. The coils of the invention are of the same type but have features adapted for solving as well as possible the dual problem of homogeneity and of the electric power to be used for creating field gradients, from field coils whose position is fixed outside a given cylinder and corresponding to an access tunnel provided for introducing the body to be examined therein.

SUMMARY OF THE INVENTION

In the invention an original method of calculating the gradient coils is applied and a particularity of the conductors of these coils has been discovered which allows a problem of minimum self-inductance and so of supply power to be efficiently solved, when the conductors are at the outset dimensioned so as to produce the highest and most homogenous gradient possible. It can for example be shown that with the conductors of the invention, for comparable intensity and homogeneity of the field, the electric power to be used is less by about 20% than the conventional solutions.

The present invention provides a gradient coil for a nuclear magnetic resonance image forming apparatus of the type having conductors each formed about a cylinder along the so-called saddle contour, these conductors being combined in four identical and symmetrical arrangements with respect to the centre of a given examination space, wherein the conductors are flat, their section being in the form of an elongated rectangle, the small dimension of the rectangle being oriented radially to the cylinder, the ratio of the large dimension to the small dimension being greater than or equal to 2.5.

BRIEF DESCRIPTION OF THE DRAWINGS

The invention will be better understood from reading the following description with reference to the accompanying figures. They are given solely by way of indication and are in no wise limitative of the invention. In the figures, the same references designate the same elements. They show:

FIG. 1: the general aspect of a gradient coil of an image forming apparatus;

FIG. 2: a schematical representation of a conductor layout used in the invention;

FIGS. 3a and 3b: a top view and a sectional view of a preferred embodiment of a detail of a gradient coil of the invention.

DESCRIPTION OF THE PREFERRED EMBODIMENT OF THE INVENTION

FIG. 1 shows a gradient coil for a nuclear magnetic resonance image forming apparatus. This apparatus is symbolized by a coil 1 of the first type which produces an intense field $B_o$ oriented along an axis Z. This apparatus further includes radiofrequency energization coils not shown. In general, these radiofrequency coils are spaced apart over a circular cylinder centered on axis Z. Their purpose is to energize with radiofrequency energy the particles of a body the image of which is desired which is located, at least partially, inside a predetermined examination space shown by a sphere 2. The gradient coil shown may be provided so as to produce flat cross-sections 3 referenced by their abscissa $x_i$ (that is to say parallel to the plane Y-Z) of the additional magnetic fields whose component oriented parallel to Z is a function of the abscissa $x_i$. This coil comprises four arrangements of conductors referenced 4 to 7. These arrangements are symmetrical with respect to the centre O of the sphere 2. These conductor arrangements symbolized here by the tracing each time of a single conductor are also symmetrical to each other with respect to a plane X-Y perpendicular to the orientation of the intense field at the center of volume 2. The conductors extend along a so-called saddle contour. Each contour comprises two hoop-shaped parts formed about a cylinder and are connected together at their ends by two parts colinear to the generatrices of this cylinder. For example, for arrangement 4 it is a question of hoops 8 and 9 and of the generatrix segments 10 and 11. The conductors of the arrangements have of course flowing therethrough currents in a suitable direction for producing the desired gradient. Each conductor of an arrangement is defined by the opening angle $a$ of the portion of the cylinder which it describes, and by the altitudes $z_i$ and $z_j$ of the ends of the genetrix segments which it comprises.

Considering technological requirements, the space required by the radiofrequency coils and the associated protective devices has led to choosing, for a sphere of examination of radius r, a circular cylinder described by the arrangements of radius R greater than r. In one example R is substantially equal to 1.6 r. This being so, in a calculating program a theoretical conductor parametered by the radius R of the cylinder which carries it, its coordinates $z_i$ and $z_j$ and its angular opening $a$ is divided into a number of consecutive elementary segments. For each position of space 2 is calculated the magnetic field contribution made by each segment of this theoretical conductor when it has a current I flowing therethrough. By summing the local contributions, the additional field which results therefrom may be calculated for each position of the space concerned. By making a similar calculation, obtained in fact by simple operations of symmetry, for the same positions of space 2 the contributions made by the small corresponding segments of the three other arrangements of the gradient core may be known. Then the component of the additional magnetic field brought by this gradient coil and which is orientated along axis Z is calculated. The structure shown in FIG. 1 is known as being adapted to produce additional fields whose component oriented along Z varies as a function of the abscissa $x_i$. For a gradient coil producing an additional field whose component oriented along Z varies with the ordinate $y_i$, the same type of coil which is quite simply rotated by 90° in space about axis Z.

At this stage, without worrying about the homogeneity, the most efficient shape of the saddle is determined which gives the largest gradient for a given current I. Thus a theoretical so-called gradient-producing saddle is defined. It has been discovered that this result was reached for $z_j$, the altitude of the hoop the closest to the centre O of the examination sphere, substantially equal to 0.29 R. Similarly $z_i$, the altitude of the hoop the furthest from the center O, is substantially equal to 1.27 R, the most favorable angle $a$ being of the order of 135°. Then the difference between the gradients thus obtained is estimated for each position of sphere 2 and the theoretical gradients which it is desired to provide. Then the differences are mapped. As it were a sort of difference relief is obtained. Such mapping may be accomplished in a series of maps corresponding to planes, parallel to a given plane and spaced evenly from each other. In one example, the chosen planes are parallel to the plane X-Y which is itself called the zero plane. At this stage of the method, in the difference reliefs are discriminated the regions of the space where the homogeneity tolerance is outside a given tolerance range. Then these defects are compensated for by adding another saddle through which flows a current I' whose differences are also mapped and whose inhomogeneity relief is revealed so that this relief compensates for the relief of the first one. Thus another saddle has been provided, also theoretical and called homogeneity corrector where the corresponding coordinates $z'_j$, $z'_i$ and $a'$ are respectively equal to 0.85 R, 1.50 R, and also 135°.

The question of homogeneity being thus solved, the power to be dissipated in the conductors for setting up the additional field must then be reduced as much as possible. It has been discovered that the best solution consists in choosing flat conductors. The rectangular section of the conductors is even such that the ratio of the large dimension to the small dimension of the section is preferably equal to 3.2. A flat conductor offers a further advantage: that of being readily superimposed on another conductor. In fact, the theoretical structure elaborated up to now shows that such superimpositions must necessarily occur. FIG. 2 shows how the calculated theoretical conductors appear once set up in a plane. The angular openings are the same as for the two saddles. The direction of currents I and I' are the same in the producing saddle 12 and in the correcting saddle 13. The fact of choosing flat conductors is favorable to superimposition since the power dissipated for installing field gradients increases with the power 5 of the radius R of the cylinder. With flat conductors, on superimposition, the increase of radius R is reduced.

For calculating the total self-inductance of the coil, the inductance external to the conductors was calculated, as is known conventionally. But in the invention the internal inductance is also calculated, that is to say the inductance which results from the fact that each conductor also bathes in its own field. The calculation of the overall inductance led to choosing flat conductors. This overall inductance calculation leads gradually to choosing the best arrangement of the real conductors, that is to say taking into account their effective dimension. Whereas, for calculating the field gradient, each conductor having been replaced by dimensionless wire, the calculation of the minimum self-inductance of the circuit is now made by taking into account the real dimensions.

The study carried out for determining the choice of the optimum section of the conductors further allows the conductors to be placed with respect to each other about the theoretical position (FIG. 2) which they must assume. In fact, taking into account the field gradient requirements, typically of the order of 0.8 Gauss per cm, and the amperes-turns required, of the order of 800 to 1600 amperes-turns, it is out of the question to provide a single conductor. In one example where a current of the order of 200 amps is available at the output of current supply means, the number of conductors in each arrangement is increased. By increasing the number of conductors, additional parameters ($z_i$, $z_j$, $\alpha$) are then available related to these conductors which improve the homogeneity of the field while maintaining a minimum self-inductance for the circuit.

FIGS. 3a and 3b give an idea of a preferred solution where the producing saddle has four conductors 15 to 18 (in the form of a horse saddle) and where the field correcting saddle also has four conductors 19 to 22. Each conductor has, for sake of simplicity, the same current flowing therethrough. In one example, this current is equal to 200 amps. This feature is used for supplying all the conductors in series. Such a series connection is conventional, as well as the power supply. They are not shown here so as not to overload the drawing. FIG. 2 shows an evolute of an eighth of an arrangement on the side 14 in FIG. 1. This is shown moreover in FIG. 3a. This representation to an eighth is preferred, for it allows the respective positions of the conductors to be well recognized. By symmetry about a plane passing through axis Z and through the middles of the cylindrical sectors $\alpha$ described by the saddles, the rest of the shape of the saddles may be deduced. In FIG. 2, the representation to an eighth is even shown in broken lines.

The producing conductors define saddle areas greater than those of the correcting conductors. They are moreover placed closer to the zero plane shown at the top of the figure. In addition, because of the required overlapping, the correcting conductors, whose influence in production is lower, are placed further from the zero plane in a layer superimposed, as much as possible, on a lower layer which contains the producing conductors. FIG. 3b shows in cross-section the sections of conductors of thickness e and width l of the invention. In a preferred example, the conductors are made from copper, the thickness is equal to 5 mm and width 16 mm. The thickness is disposed radially to the cylinder. The cylinder carries the conductors in two layers, a first layer 23 and a second directly superimposed layer 24. If we call R the radius of the cylinder which carries the conductors, in a preferred example, the angular openings of the altitudes $z_j$ and $z_i$ of each of the conductors are given in the following table:

| | | | |
|---|---|---|---|
| 15 | 150° 00' | 0.291 R | 1.332 R |
| 16 | 137° 18' | 0.250 R | 1.291 R |
| 17 | 132° 42' | 0.291 R | 1.250 R |
| 18 | 105° 00' | 0.332 R | 1.209 R |
| 19 | 145° 24' | 0.790 R | 1.621 R |
| 20 | 137° 18' | 0.831 R | 1.580 R |
| 21 | 132° 42' | 0.872 R | 1.415 R |
| 22 | 105° 00' | 0.914 R | 1.374 R |

These parameters may be varied by about ±10% without appreciably affecting the interest of the invention. This variation may markedly result from a choice of conductors even flatter (thickness halved) occupying more space inside each other, while being adjacent, in their respective saddles.

It will be noted that conductors 16 and 20, 17 and 21 and 18 and 22 have respectively the same angular openings. In FIG. 3a however their images have not been superimposed. This arrangement results from the fact that the second mentioned are situated in a radially more external layer and so the development of which is greater.

The choice of flat conductors has advantages. The conductors are superimposed directly along generatrix segments of the cylinder, that is to say where it has no influence on the field gradient, and are on the other hand disposed as close as possible to each other in the hoop segments of the saddle. The formation properly speaking of the conductors in shapes shown in FIG. 3 is obtained by traditional methods. They are first formed flat. Then they are formed into a saddle about a cylinder. Taking into account what has gone before the preferred ratio of e to R is between 0.5% and 3%. Typically it is equal to 1%. The conductors are isolated from each other either by a film of varnish or by any other means.

What is claimed is:

1. A gradient coil for nuclear magnetic resonance image forming apparatus of the type having conductors each formed about the cylinder along a so-called saddle contour, these conductors being gathered together in four identical arrangements symmetrical with respect to the center of a predetermined examination space, wherein the conductors are flat, their section being in the form of an elongated rectangle, the small dimension of the rectangle being oriented radially to the cylinder, the ratio of the larger dimension to the small dimension being not less than 2.5, and wherein the four arrangements each include eight conductors, the eight conductors being defined in each arrangement by their angular opening parameters and by the axial position of the hoop parts of the saddle which they form, these parameters being respectively equal, within plus or minus 10%, to:

| | | | |
|---|---|---|---|
| for the first conductor | 150°00' | 0.291 R | 1.332 R |
| for the second conductor | 137°18' | 0.250 R | 1.291 R |
| for the third conductor | 132°42' | 0.291 R | 1.250 R |
| for the fourth conductor | 105°00' | 0.332 R | 1.209 R |
| for the fifth conductor | 145°24' | 0.790 R | 1.621 R |
| for the sixth conductor | 137°18' | 0.831 R | 1.580 R |
| for the seventh conductor | 132°42' | 0.872 R | 1.415 R |
| for the eighth conductor | 105°00' | 0.914 R | 1.374 R | where R is the radius of the cylinder which carries them.

2. The coil as claimed in claim 1, having conductors distributed in two layers.

3. The coil as claimed in claim 1 or 2, wherein each arrangement includes a first group of so-called field producing conductors and a second group of so-called field correcting conductors, the conductors of each group having the same current passing therethrough, the conductors of the second group being further away from the examination space than the conductors of the first group, the flux produced by the second group being less than the flux produced by the first.

4. The coil as claimed in claim 2, wherein the two layers are directly superimposed.

5. The coil as claimed in claim 1, wherein the dimension ratio of the section of the conductors is equal to 3.2

6. The coil as claimed in any one of claims 1 to 2, wherein the dimension of the small side of the section is of the order of 1% of the radius of the cylinder.

* * * * *